US010393820B2

(12) United States Patent
Mitsuyama et al.

(10) Patent No.: US 10,393,820 B2
(45) Date of Patent: Aug. 27, 2019

(54) SECONDARY BATTERY STATE DETECTING DEVICE AND SECONDARY BATTERY STATE DETECTING METHOD

(71) Applicants: FURUKAWA ELECTRIC CO., LTD., Tokyo (JP); FURUKAWA AUTOMOTIVE SYSTEMS INC., Shiga (JP)

(72) Inventors: Taiji Mitsuyama, Tokyo (JP); Noriyasu Iwane, Tokyo (JP); Koichi Yokoyama, Tokyo (JP); Naoya Takashima, Tokyo (JP); Antal Kovats, Budapest (HU); Tamas Mihalffy, Budapest (HU); Lorand Romvari, Budapest (HU)

(73) Assignees: FURUKAWA ELECTRIC CO., LTD., Tokyo (JP); FURUKAWA AUTOMOTIVE SYSTEMS INC., Shiga (JP)

( * ) Notice: Subject to any disclaimer, the term of this patent is extended or adjusted under 35 U.S.C. 154(b) by 314 days.

(21) Appl. No.: 14/846,682

(22) Filed: Sep. 4, 2015

(65) Prior Publication Data
US 2015/0377978 A1 Dec. 31, 2015

Related U.S. Application Data

(63) Continuation of application No. PCT/JP2014/054242, filed on Feb. 23, 2014.

(30) Foreign Application Priority Data

Mar. 7, 2013 (JP) .................................. 2013-046031

(51) Int. Cl.
*G01R 31/389* (2019.01)
*G01R 31/392* (2019.01)
(Continued)

(52) U.S. Cl.
CPC ....... *G01R 31/392* (2019.01); *G01R 31/3648* (2013.01); *G01R 31/389* (2019.01);
(Continued)

(58) Field of Classification Search
CPC ............ G01R 31/3679; G01R 31/3662; G01R 31/3648; G01R 31/3624; H02J 7/007; H02J 7/0021; H01M 10/44; H01M 10/48
See application file for complete search history.

(56) References Cited

U.S. PATENT DOCUMENTS

2006/0186890 A1* 8/2006 Iwane ................ G01R 31/3662
324/426
2007/0148532 A1* 6/2007 Lim ..................... G01R 31/361
429/50
(Continued)

FOREIGN PATENT DOCUMENTS

JP 2005-221487 A 8/2005
JP 2007-57379 A 3/2007
(Continued)

OTHER PUBLICATIONS

International Search Report dated May 27, 2014 for International Application No. PCT/JP2014/054242, 2 pages.

*Primary Examiner* — Khamdan N. Alrobaie
(74) *Attorney, Agent, or Firm* — Amin, Turocy & Watson, LLP

(57) ABSTRACT

To provide a secondary battery state detecting device that decreases the deterioration in capacity of the secondary battery and is low in arithmetic cost.
A secondary battery state detecting device that detects a state of a secondary battery includes discharge means (discharge circuit (15)) for subjecting the secondary battery (14) to a pulse discharge, acquiring means (controller (10)) for controlling the discharge means to subject the secondary battery to at least one pulse discharge, and acquiring a time variation (Continued)

of a voltage value at that time, calculating means (controller (10)) for calculating a parameter of a predetermined function having time as a variable by fitting the variation of the voltage value acquired by the acquiring means using the predetermined function, and detecting means (controller (10)) for detecting the state of the secondary battery on the basis of the parameter of the predetermined function calculated by the calculating means.

20 Claims, 10 Drawing Sheets

(51) Int. Cl.
    *H01M 10/44*     (2006.01)
    *H01M 10/48*     (2006.01)
    *G01R 31/36*     (2019.01)
    *H02J 7/00*     (2006.01)
    *G01R 31/3842*     (2019.01)

(52) U.S. Cl.
    CPC ........... *H01M 10/44* (2013.01); *H01M 10/48* (2013.01); *H02J 7/007* (2013.01); *H02J 7/0021* (2013.01); *G01R 31/3842* (2019.01)

(56) References Cited

U.S. PATENT DOCUMENTS

| | | | | |
|---|---|---|---|---|
| 2008/0120050 A1* | 5/2008 | Iwane | ................ | G01R 31/3679 702/63 |
| 2008/0265840 A1* | 10/2008 | De Paula | ............. | G01R 31/367 320/132 |
| 2010/0090651 A1* | 4/2010 | Sahu | ................... | G01R 31/3624 320/132 |
| 2013/0234672 A1* | 9/2013 | Kubota | ................ | G01R 31/362 320/134 |
| 2014/0028277 A1* | 1/2014 | Ohashi | .................... | H02M 3/02 323/299 |
| 2016/0003912 A1* | 1/2016 | Iwane | .................... | H02J 7/0021 702/63 |
| 2016/0169975 A1* | 6/2016 | Lin | ................... | G01R 31/3662 702/63 |
| 2016/0375790 A1* | 12/2016 | Komiyama | ......... | B60L 11/1861 320/136 |

FOREIGN PATENT DOCUMENTS

| | | |
|---|---|---|
| JP | 2008-32683 A | 2/2008 |
| JP | 2009-244180 A | 10/2009 |

\* cited by examiner

SECONDARY BATTERY STATE DETECTING DEVICE AND SECONDARY BATTERY STATE DETECTING METHOD

CROSS-REFERENCE TO RELATED APPLICATIONS

This application is a continuation application of, and claims priority to, International Application No. PCT/JP2014/054242, filed Feb. 23, 2014 and entitled "SECONDARY BATTERY STATE DETECTING DEVICE AND SECONDARY BATTERY STATE DETECTING METHOD", which claims priority to Japanese Patent Application No. 2013-046031, filed Mar. 7, 2013, the disclosures of each of which are incorporated herein by reference in their entireties.

TECHNICAL FIELD

The present invention relates to a secondary battery state detecting device and a secondary battery state detecting method.

BACKGROUND ART

Patent Document 1 discloses a technique in which a secondary battery is subjected to a pulse discharge with a constant current at a frequency of 100 Hz or greater, a voltage difference of the secondary battery between before and immediately after a pulse discharge is determined, and a dischargable capacity from fully charged state or a degradation degree of the secondary battery from this voltage difference is detected.

Further, Patent Document 2 discloses a technique in which data of a voltage and a current of a secondary battery mounted to an actual vehicle is acquired, and the data is converted to a frequency domain by Fourier transformation to determine an impedance spectrum. Then, on the basis of the determined impedance spectrum, constant fitting in an equivalent circuit model of the secondary battery is performed to determine a resistance component and double layer capacity component of the secondary battery, and then the state of the secondary battery is detected on the basis thereof.

CITATION LIST

Patent Literature

Patent Document 1: Japanese Unexamined Patent Application Publication No. 2009-244180A
Patent Document 2: Japanese Unexamined Patent Application Publication No. 2005-221487A

SUMMARY OF INVENTION

Technical Problem

According to the technique disclosed in Patent Document 1, a pulse discharge needs to be executed multiple times which is equal to or greater than a certain number of times, resulting in the problem of causing deterioration in the capacity of the secondary battery.

Further, according to the technique disclosed in Patent Document 2, an arithmetic load of the Fourier transformation processing is high, requiring a processor with high processing capability, resulting in the problem of high cost.

Hence, an object of the present invention is to provide a secondary battery state detecting device and a secondary battery state detecting method that decrease the deterioration in capacity of the secondary battery and are low in arithmetic cost.

Solution to Problem

To solve the above described problem, according to the present invention, a secondary battery state detecting device that detects a state of a secondary battery includes: discharge means for subjecting the secondary battery to a pulse discharge; acquiring means for controlling the discharge means to subject the secondary battery to at least one pulse discharge, and acquiring a time variation of a voltage value at that time, calculating means for calculating a parameter of a predetermined function having time as a variable by fitting the variation of a voltage value acquired by the acquiring means using the predetermined function; and detecting means for detecting the state of the secondary battery on the basis of the parameter of the predetermined function calculated by the calculating means. According to such a configuration, it is possible to decrease the deterioration in capacity of the secondary battery and reduce the arithmetic cost.

Further, according to an aspect of the present invention, the calculating means calculate the parameter of the predetermined function with a value acquired by dividing the voltage value acquired by the acquiring means by a current value.

According to such a configuration, it is possible to decrease the impact of variation in the current and accurately detect the state of the secondary battery.

Further, according to an aspect of the present invention, the predetermined function is a linear function having time as a variable, and the detecting means detect the state of the secondary battery on the basis of a slope of the linear function.

According to such a configuration, it is possible to reduce the calculation load using a linear function having few parameters.

Further, according to an aspect of the present invention, the predetermined function is an exponential function having time as a variable, and the detecting means detect the state of the secondary battery on the basis of a coefficient of the exponential function.

According to such a configuration, it is possible to detect the state of the secondary battery more accurately than the linear function.

Further, according to an aspect of the present invention, the detecting means calculate a resistance value of a reaction resistance of the secondary battery from the coefficient of the exponential function, and detects the state of the secondary battery on the basis of the resistance value.

According to such a configuration, it is possible to accurately detect the state of the secondary battery on the basis of a reaction resistance having significant variation due to degradation.

Further, according to an aspect of the present invention, the detecting means calculate at least one of a capacity value of an electric double layer capacity and a resistance value of an ohmic resistance of the secondary battery from the coefficient of the exponential function, and detect the state of the secondary battery using at least one of the capacity value and the resistance value.

According to such a configuration, it is possible to detect the state of the secondary battery more accurately than a case where only a reaction resistance is used.

Further, according to an aspect of the present invention, the calculating means perform fitting using the predetermined function having time as a variable, on the basis of one of a least square operation and a Kalman filter operation. According to such a configuration, it is possible to reduce a processing load compared to a case where, for example, Fourier transformation is executed.

Further, according to an aspect of the present invention, the detecting means calculate at least one of a degradation degree and a dischargable capacity from fully charged state of the secondary battery on the basis of the parameter calculated by the calculating means.

According to such a configuration, it is possible to accurately determine the state of the secondary battery on the basis of at least one of a degradation degree and a dischargable capacity from fully charged state of the secondary battery.

Further, according to the present invention, a secondary battery state detecting method of detecting a state of a secondary battery includes: a discharging step of subjecting the secondary battery to a pulse discharge; an acquiring step of subjecting the secondary battery to at least one pulse discharge in the discharging step, and acquiring a time variation of a voltage value at that time; a calculating step of calculating a parameter of a predetermined function having time as a variable by fitting the variation of the voltage value acquired in the acquiring step using the predetermined function; and a detecting step of detecting the state of the secondary battery on the basis of the parameter of the predetermined function calculated in the calculating step. According to such a method, it is possible to decrease the deterioration in capacity of the secondary battery and reduce the arithmetic cost.

Advantageous Effects of Invention

According to the present invention, it is possible to provide the secondary battery state detecting device and the secondary battery state detecting method capable of decreasing the deterioration in capacity of the secondary battery and reducing the arithmetic cost.

DESCRIPTION OF EMBODIMENTS

Next, a description will be given of embodiments of the present invention.

(A) Description of Configuration of First Embodiment

Figure 1:
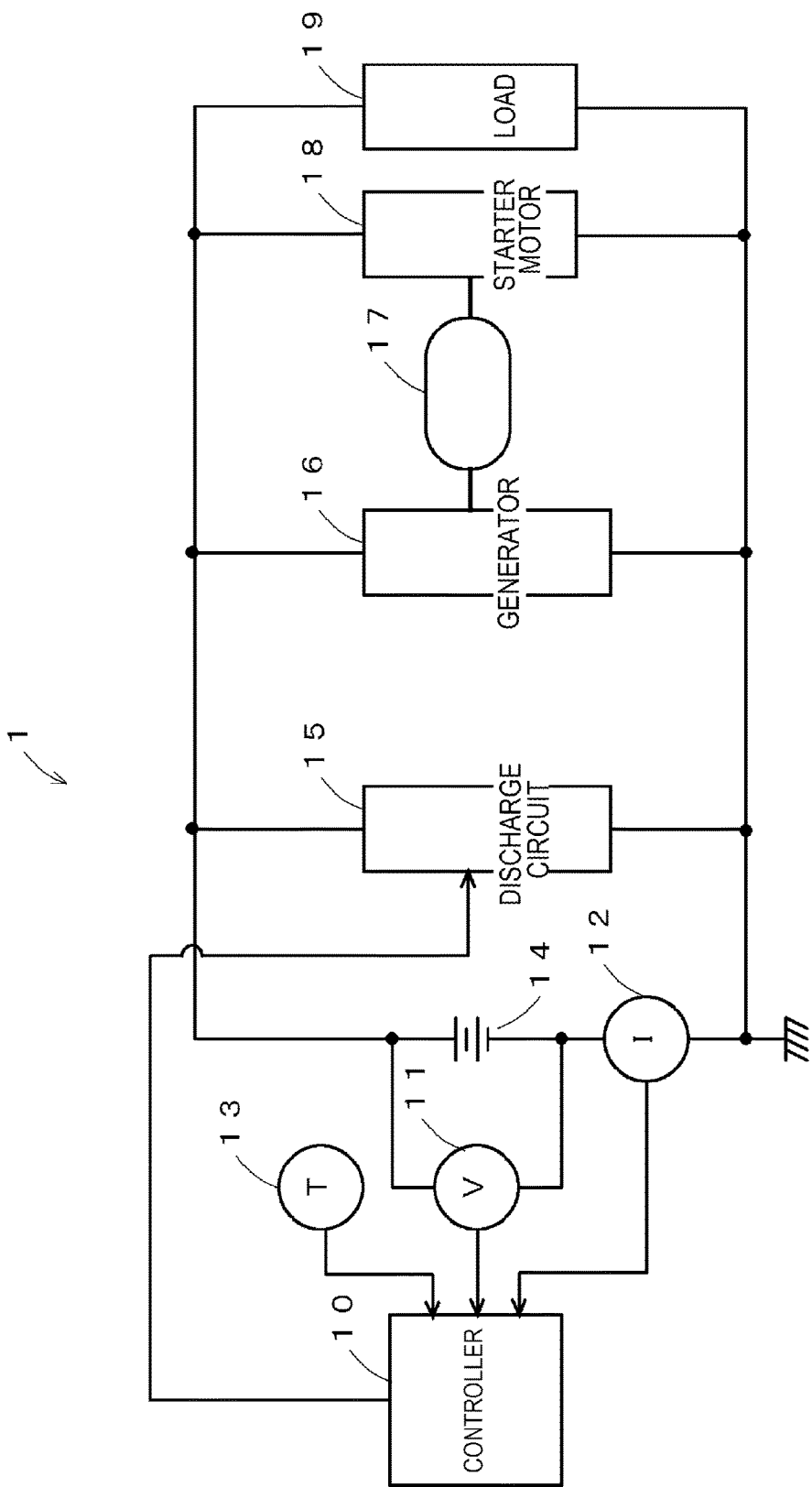
FIG. 1 is a diagram illustrating a configuration example of a secondary battery state detecting device according to a first embodiment of the present invention.

FIG. 1 is a diagram illustrating a power supply system of a vehicle that includes a secondary battery state detecting device according to the first embodiment of the present invention. In FIG. 1, a secondary battery state detecting device 1 includes a controller 10, a voltage sensor 11, a current sensor 12, a temperature sensor 13, and a discharge circuit 15 as main components, and detects a state of a secondary battery 14. Here, the controller 10 refers to outputs from the voltage sensor 11, the current sensor 12, and the temperature sensor 13, and detects the state of the secondary battery 14. The voltage sensor 11 detects a terminal voltage of the secondary battery 14, and notifies the controller 10 of the voltage value. The current sensor 12 detects a current introduced through the secondary battery 14, and notifies the controller 10 of the current value. The temperature sensor 13 detects an ambient temperature of the secondary battery 14 itself or of the surrounding area, and notifies the controller 10 of the temperature value. The discharge circuit 15 includes, for example, a semiconductor switch, a resistance element, and the like that are serially connected. The controller 10 controls the semiconductor switch to be on or off so that the secondary battery 14 is subjected to a pulse discharge. It should be noted that, rather than discharge via the resistance element, for example, discharge via a constant current circuit may be performed so that the discharging current is constant.

The secondary battery 14 includes, for example, a lead-acid battery, a nickel-cadmium battery, a nickel-metal hydride battery, a lithium-ion battery, or the like. The secondary battery 14 is charged by a generator 16, and drives a starter motor 18 to start an engine while supplying power to a load 19. The generator 16 driven by an engine 17 generates AC power, converts the AC power to DC power with a rectifier circuit, and charges the secondary battery 14.

The engine 17 includes, for example, a reciprocating engine, a rotary engine, or the like, such as a petrol engine or a diesel engine. The engine 17 started by the starter motor 18 drives a drive wheel via a transmission to apply a driving force to the vehicle, and drives the generator 16 to generate power. The starter motor 18 includes, for example, a DC motor. The starter motor 18 generates a rotational force with the power supplied from the secondary battery 14 to start the engine 17. The load 19 includes, for example, an electric steering motor, a defogger, an ignition coil, a vehicle audio, an automotive navigation system, or the like. The load 19 is operated by the power supplied from the secondary battery 14.

Figure 2:
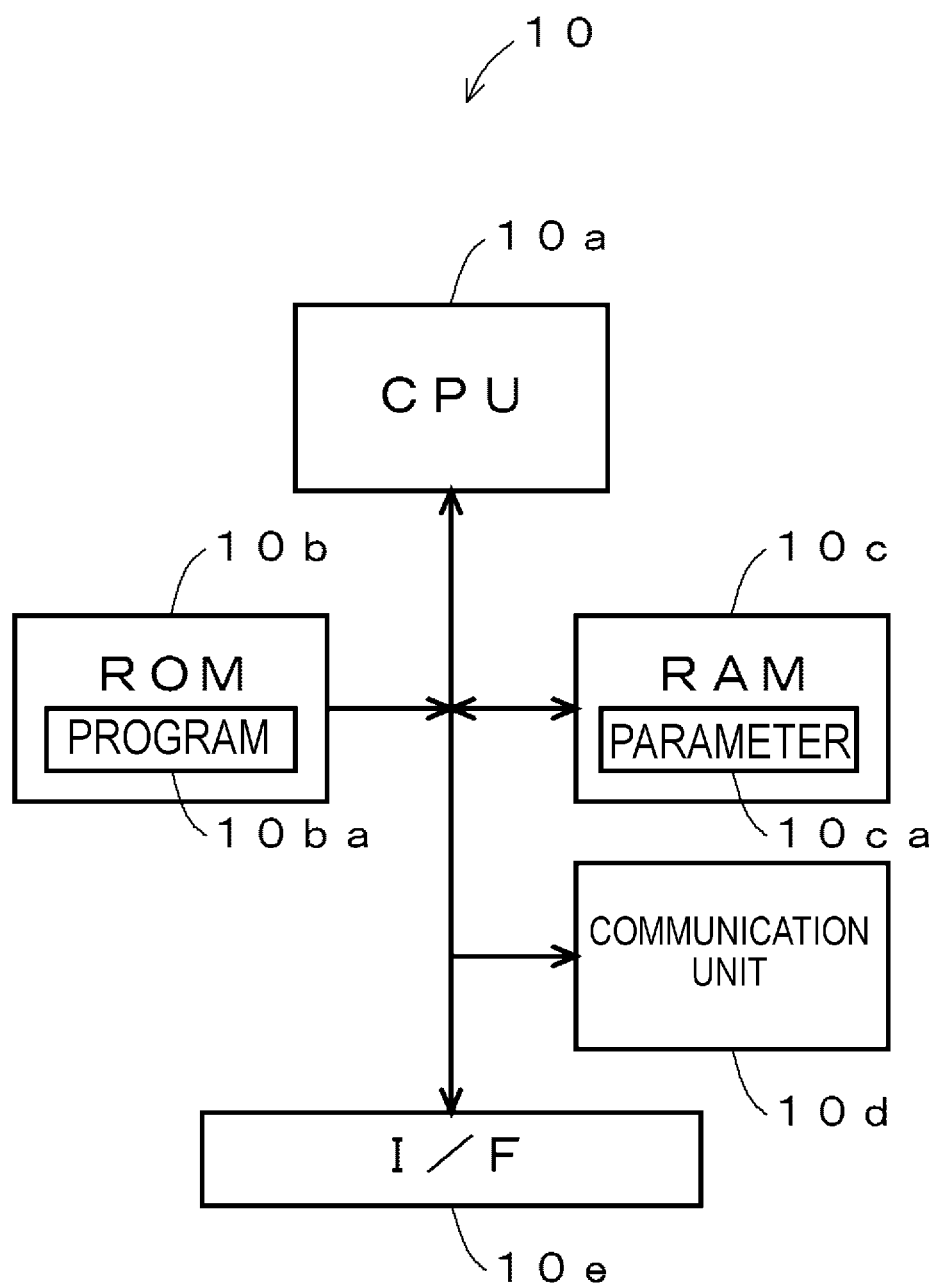
FIG. 2 is a block diagram illustrating a detailed configuration example of a controller in FIG. 1.

FIG. 2 is a diagram illustrating a detailed configuration example of the controller 10 illustrated in FIG. 1. As illustrated in FIG. 2, the controller 10 includes a central processing unit (CPU) 10a, a read only memory (ROM) 10b, a random access memory (RAM) 10c, a communication unit 10d, and an interface (I/F) 10e. Here, the CPU 10a controls each unit on the basis of a program 10ba stored in the ROM 10b. The ROM 10b includes a semiconductor memory and the like, and stores the program 10ba and the like. The RAM 10c includes a semiconductor memory and the like, and stores data generated when the program ba is executed, and a parameter 10ca such as a mathematical expression described later. The communication unit 10d communicates with an electric control unit (ECU), which is an upper device, and the like, and notifies the upper device of the detected information. The I/F 10e converts signals supplied from the voltage sensor 11, the current sensor 12, and the temperature sensor 13 to digital signals, takes the converted signals, supplies a driving current to the discharge circuit 15, and controls the discharge circuit 15.

(B) Description of Operation of First Embodiment

Next, the operation of the first embodiment will be described with reference to drawings. In the following, the principle of operation of the first embodiment will be described, followed by the detailed operation with reference to a flowchart.

Figure 3:
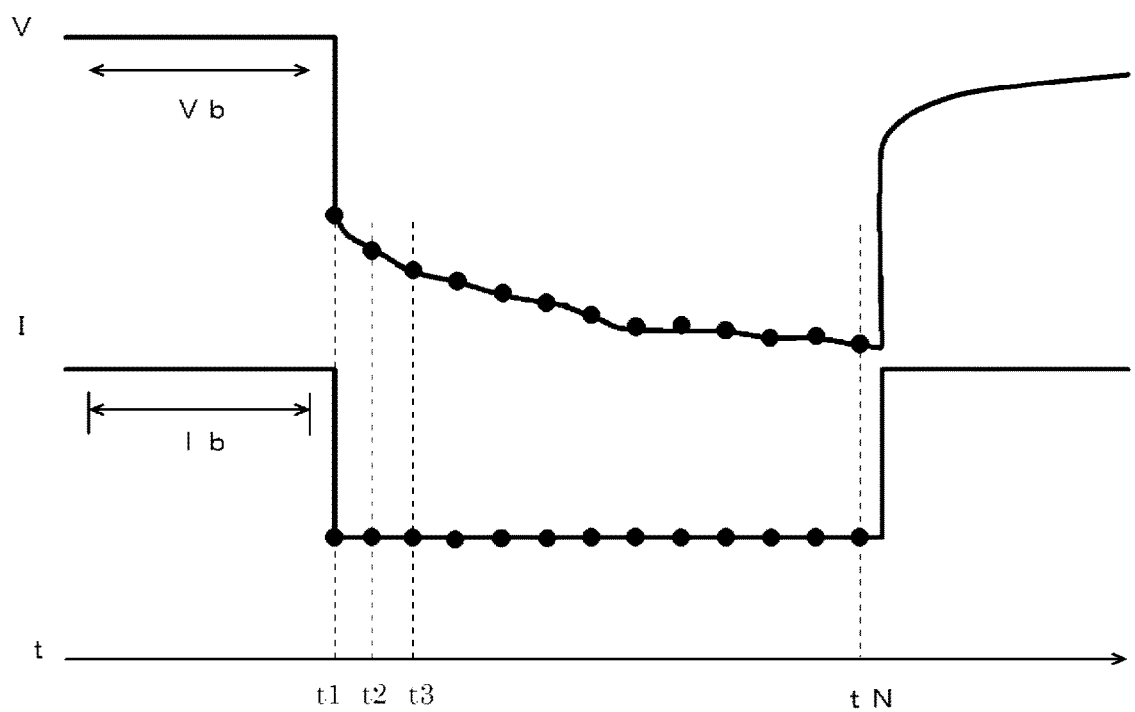
FIG. 3 is a diagram for explaining the operation of the first embodiment of the present invention.

When detecting the state of the secondary battery 14, the CPU 10a of the controller 10 controls the discharge circuit 15 to subject the secondary battery 14 to a pulse discharge, and then measures the time variation of the voltage and current at that time. FIG. 3 is a diagram illustrating the time variation of the voltage and current during pulse discharging. In this FIG. 3, the horizontal axis indicates time, and the vertical axis indicates current or voltage. First, the CPU 10a measures a voltage Vb before the start of discharge and a current Ib before the start of discharge. Next, the CPU 10a controls the discharge circuit 15 to subject the secondary battery 14 to a pulse discharge. At this time, the CPU 10a samples the outputs of the voltage sensor 11 and the current sensor 12 at predetermined cycles. In the example in FIG. 3, sampling is executed at timings t1, t2, t3, . . . , tN to acquire the voltage values and current values of the secondary battery 14.

Next, the CPU 10a respectively divides the time-series voltage values V (tn) sampled at the timings t1, t2, t3, . . . , tN by the time-series current values I (tn) sampled at the same timings to acquire time-series resistance values R (tn). It should be noted that, rather than using the voltage values as are, drop voltages ΔV (tn) may be determined from the voltage Vb before the start of discharge, and these drop voltages ΔV (tn) may be respectively divided by the current values I (tn) to acquire the time-series resistance values R (tn).

Next, the CPU 10a fits the time-series resistance values R (tn) using a linear function f (tn) indicated in a formula (1) below, and determines coefficients a, b. Specifically, the CPU 10a determines the coefficients a, b by performing fitting using a least square operation or a Kalman filter operation.

$$f(tn) = a \cdot tn + b \quad (1)$$

Figure 4:
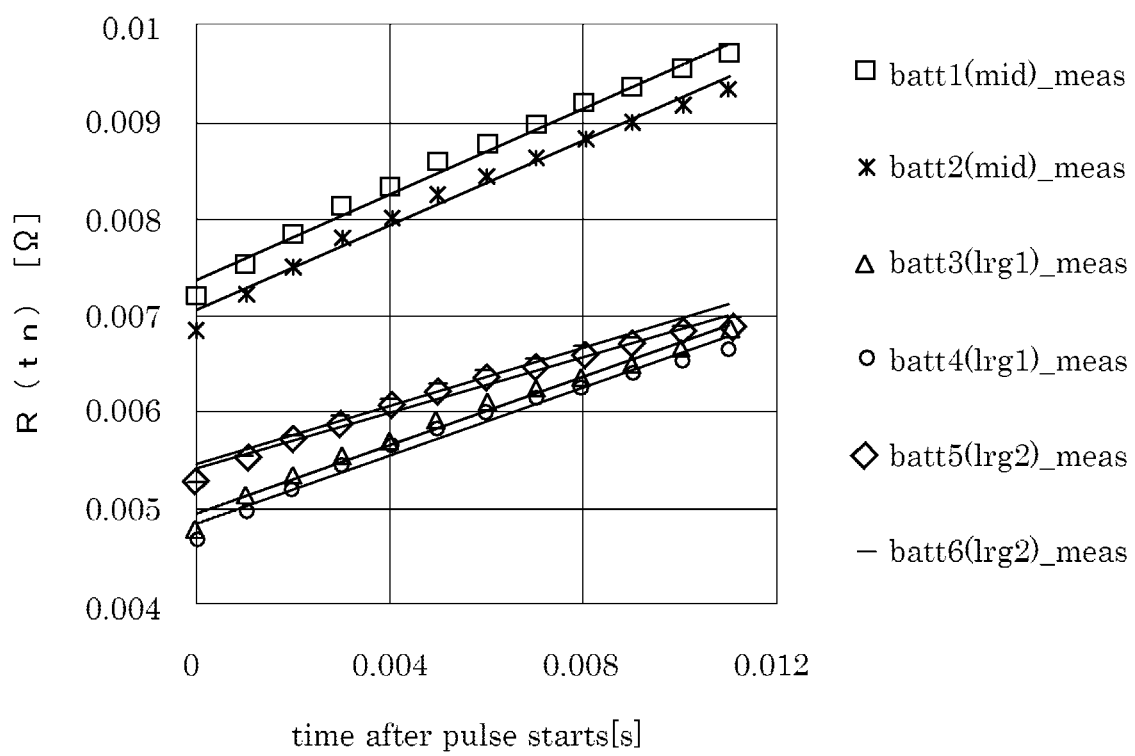
FIG. 4 is a diagram showing an example of fitting by a linear function.

FIG. 4 shows measurement values for a plurality of types of the secondary battery 14. In this FIG. 4, batt 1, 2, batt 3, 4, and batt 5, 6 each indicate a secondary battery having the same initial capacity (or nominal capacity), with batt 1, 2 indicating secondary batteries having an initial capacity of an intermediate level, and batt 3, 4 and batt 5, 6 indicating secondary batteries having an initial capacity greater than that of batt 1, 2. As shown in this diagram, the resistance value differs according to the capacity of the secondary battery, but the slope does not substantially vary if the capacity is the same but the type is different. It should be noted that the value of the coefficient a corresponding to the slope of the graph is highly correlated with the reaction resistance value of the secondary battery 14. This reaction resistance increases in accordance with the degradation in the secondary battery 14, making it possible to accurately determine the state of the secondary battery 14 regardless of the type of the secondary battery 14 by determining the coefficient a of the linear function f (tn) indicated in formula (1).

Figure 5:
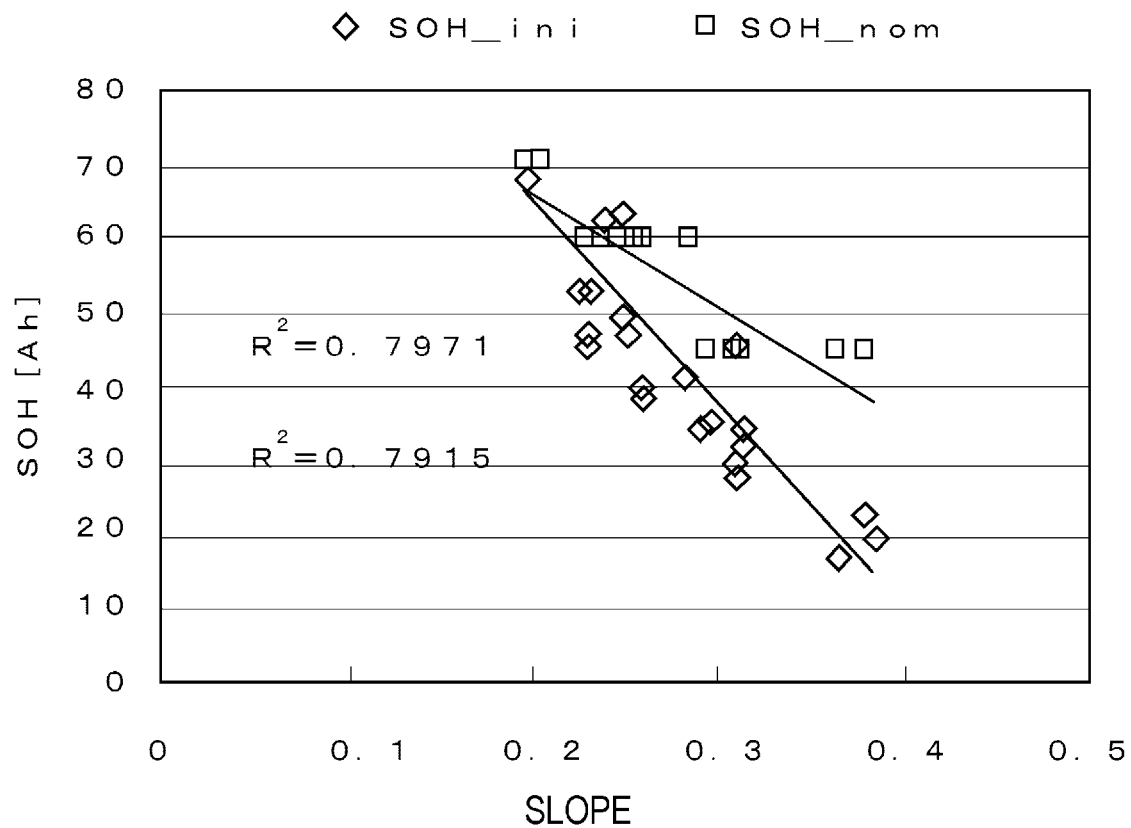
FIG. 5 is a diagram showing the relationship between a slope of the linear function and a state of health (SOH).

FIG. 5 is a diagram showing the relationship between the slope of the linear function and the initial capacity of the secondary battery 14. In this FIG. 5, the horizontal axis indicates a slope a of the linear function, and the vertical axis indicates a state of health (SOH). Further, in the diagram, a diamond shape (SOH_ini) indicates a measured initial capacity, and a square (SOH_nom) indicates a nominal capacity. As shown in this FIG. 5, the nominal capacity and slope have a determination coefficient of about 0.7915. Further, the measured initial capacity and slope have a determination coefficient of about 0.7971. Thus, it can be said that the nominal value or measurement value of the secondary battery 14 has a high correlation with the slope. As a result, it is possible to presume that a high correlation exists between the SOH and the slope as well.

Figure 6:
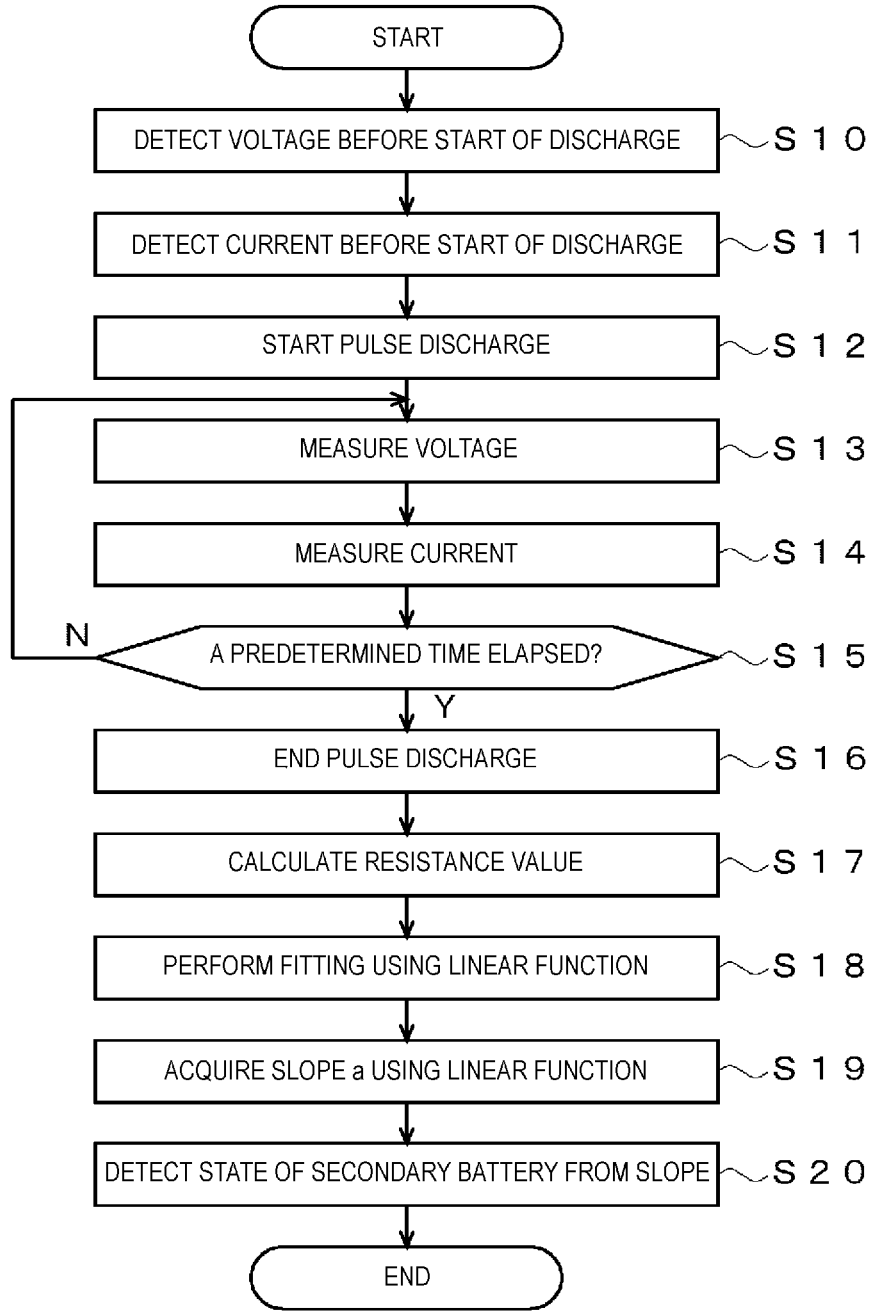
FIG. 6 is a flowchart for explaining the flow of processing executed in the first embodiment.

Next, an example of the processing executed in the controller 10 illustrated in FIG. 1 will be described with reference to FIG. 6. The flowchart illustrated in FIG. 6 is executed if the state of the secondary battery 14 is to be detected, and is realized by reading the program 10ba stored in the ROM 10b, and executing the program 10ba on the CPU 10a. It should be noted that the execution timing may be after the elapse of a predetermined time (a few hours, for example) since the engine 17 stops. Naturally, a timing other than this is also acceptable. When the processing of this flowchart is started, the following steps are executed.

In step S10, the CPU 10a refers to the output of the voltage sensor 11, and detects the voltage Vb before the start of discharge shown in FIG. 3.

In step S11, the CPU 10a refers to the output of the current sensor 12, and detects the current Ib before the start of discharge shown in FIG. 3.

In step S12, the CPU 10a controls the discharge circuit 15, and starts the pulse discharge of the secondary battery 14. It should be noted that pulse discharge methods include, for example, a discharge method via a resistance element, and a discharge method via a constant current circuit. It should also be noted that, according to the latter method, it is possible to simplify the processing of calculating the resistance value described later because a constant current is introduced. Further, it is possible to reduce the load of the secondary battery 14 by limiting the current value.

In step S13, the CPU 10a measures the voltage of the secondary battery 14.

More specifically, the CPU 10a refers to the output of the voltage sensor 11, measures the voltage V (tn) of the secondary battery 14 at the timing tn, and stores the measured value as the parameter 10ca in the RAM 10c.

In step S14, the CPU 10a measures the current of the secondary battery 14. More specifically, the CPU 10a refers to the output of the current sensor 12, measures the current I (tn) of the secondary battery 14 at the timing tn, and stores the measured value as the parameter 10ca in the RAM 10c.

In step S15, the CPU 10a determines whether or not a predetermined time has elapsed from the start of pulse discharge and proceeds to step S16 if the predetermined time has elapsed (Yes in step S15), and, in any other case (No in step S15), returns to step S13 and repeats the same processing as described above. For example, as illustrated in FIG. 3, if the Nth sampling has ended, the CPU 10a makes the determination Yes, and the flow proceeds to step S16.

In step S16, the CPU 10a ends the pulse discharge. More specifically, the CPU 10a controls the discharge circuit 15 to end the pulse discharge.

In step S17, the CPU 10a determines the time-series resistance values R (tn). More specifically, the CPU 10a respectively divides the time-series voltage values V (tn) measured in step S13 by the time-series current values (tn) to determine the time-series resistance values R (tn). The acquired time-series resistance values R (tn) are stored as the parameter 10ca in the RAM 10c.

In step S18, the CPU 10a fits the time-series resistance values R (tn) determined in step S17 using the linear function f (tn) indicated in the aforementioned formula (1) to determine the coefficients a, b. More specifically, for example, the CPU 10a performs linear function fitting by using a least square operation or a Kalman filter operation, making it possible to acquire the coefficients a, b.

In step S19, the CPU 10a acquires the coefficient a, which is the slope of the linear function determined in step S18.

In step S20, the CPU 10a detects the state of the secondary battery 14 on the basis of the coefficient a acquired in step S19. More specifically, when degradation in the secondary battery 14 advances, the value of the coefficient a increases, making it possible to detect the degradation state of the secondary battery 14 on the basis of the level of the value of the coefficient a.

It should be noted that while, according to the above processing, the resistance value is acquired by directly dividing the voltage value measured in step S13 by the current value measured in step S14, the resistance value R (tn) may be determined by, for example, dividing a voltage $\Delta V$ (tn) of a difference acquired by subtracting the voltage Vb before the start of discharge from the measured voltage value, by the current value I (tn).

Further, the variation in the resistance value caused by the temperature of the secondary battery 14 may be stored as a table in the ROM 10b, and the resistance value determined in step S17 may be temperature-corrected on the basis of the temperature of the secondary battery 14, the temperature being detected with reference to the output of the temperature sensor 13. According to such a method, it is possible to prevent the occurrence of an error caused by temperature.

(C) Description of Second Embodiment

Next, the second embodiment will be described. It should be noted that the configuration of the second embodiment is the same as that in FIGS. 1 and 2, and a description thereof will be omitted. The second embodiment differs from the first embodiment in that fitting is performed using an exponential function rather than a linear function. In the following, the principle of operation of the second embodiment will be described, followed by a description of the detailed operation with reference to a flowchart.

Figure 7:
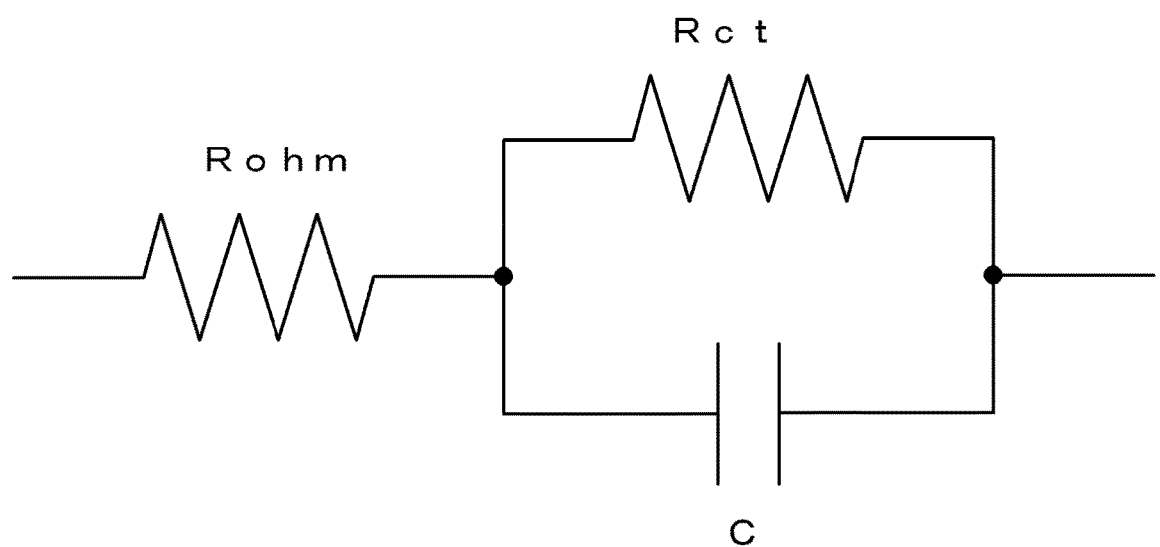
FIG. 7 is a diagram illustrating an example of an equivalent circuit of a secondary battery used in a second embodiment.

FIG. 7 illustrates an equivalent circuit of the secondary battery 14 used in the second embodiment.

As illustrated in FIG. 7, according to the second embodiment, the secondary battery 14 is approximated by an ohmic resistance Rohm, a reaction resistance Rct, and an electric double layer capacity C. Here, the resistance Rohm indicates, for example, a liquid resistance of the secondary battery 14. Further, the reaction resistance Rct (Charge Transfer Resistance) is the resistance when the charge transfers. Further, the electric double layer capacity C indicates the value of the capacity formed by pairs of positive and negative charged particles being formed and arranged in a stratified structure on the interface as a result of the transfer of the charged particles in accordance with an electric field.

Further, according to the second embodiment, fitting is performed using the exponential function indicated in a formula (2) below, for example. It should be noted that a formula other than this is acceptable as well.

$$f(tn)=A\times(1-\exp(-tn/\tau))+B \qquad (2)$$

Here, A=Rct, B=Rohm, and $\tau$=C×Rct where C is the electric double layer capacity.

Figure 8:
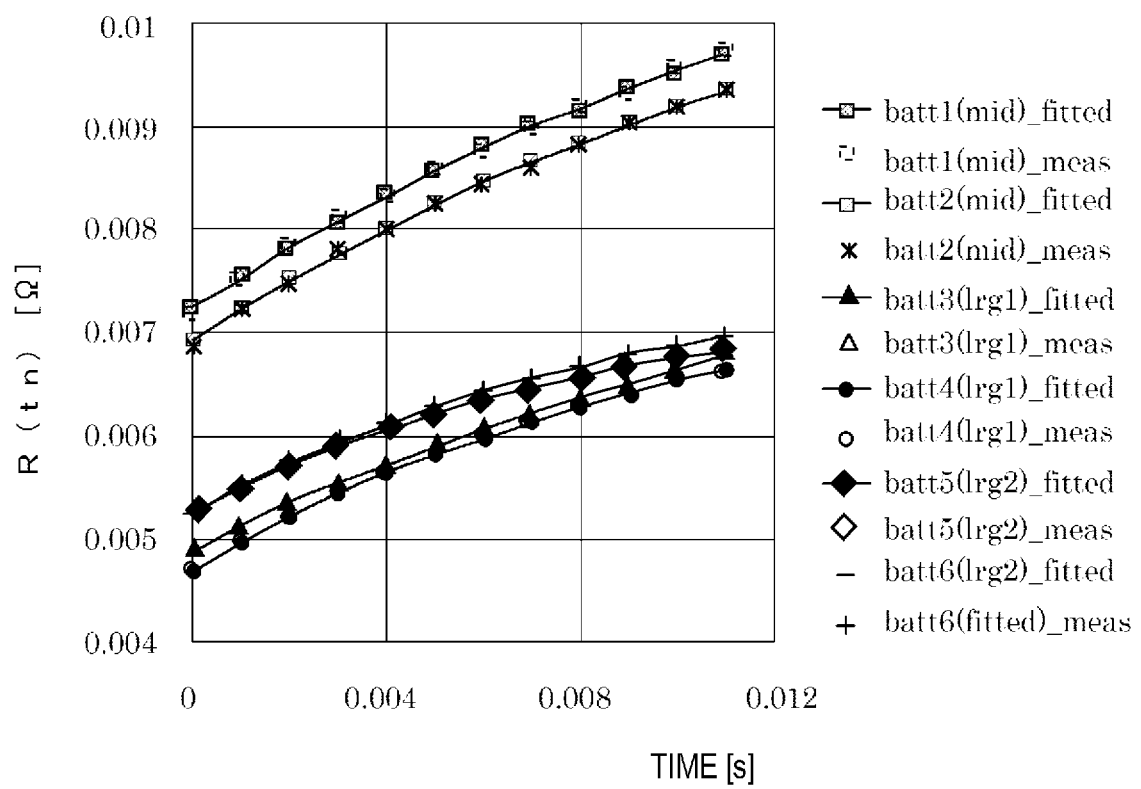
FIG. 8 is a diagram showing an example of fitting by an exponential function.

FIG. 8 is a diagram showing the results of fitting based on formula (2). In FIG. 8, "meas" indicates the measurement result, and "fitted" indicates the fitting result. As shown in this diagram, the measurement result and the fitting result are in close agreement.

Figure 9:
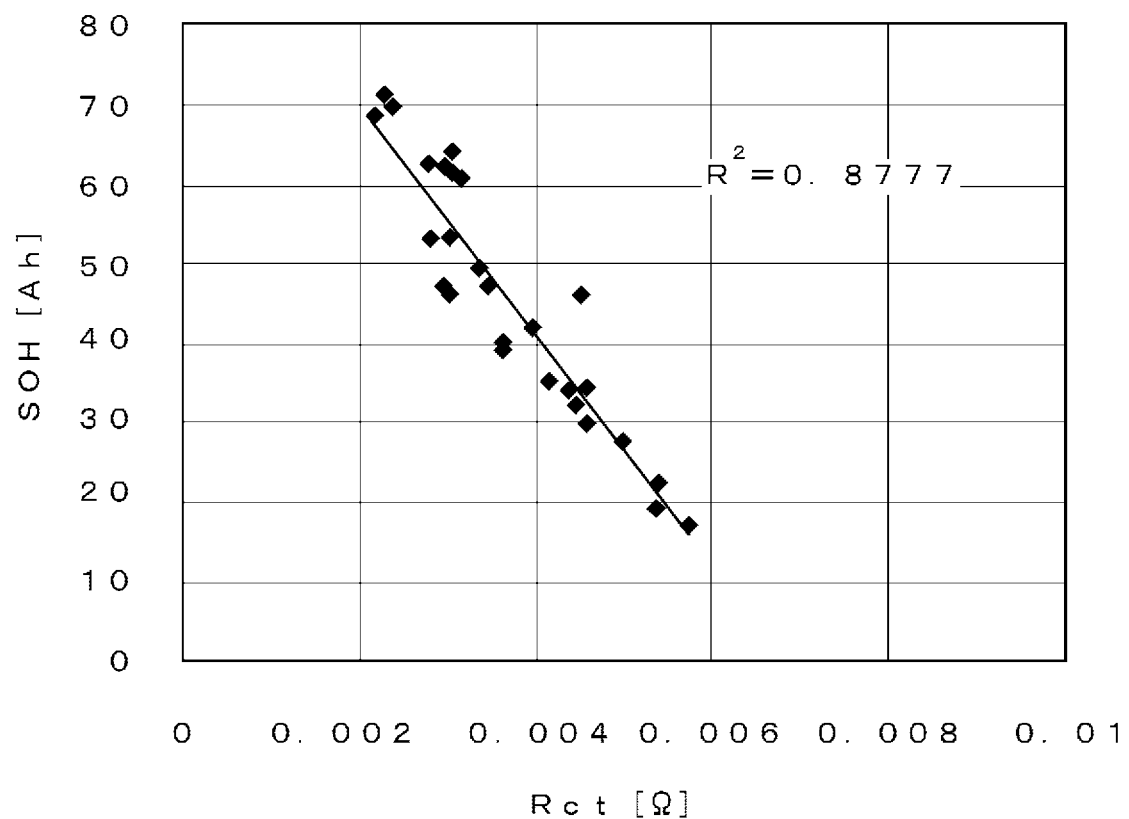
FIG. 9 is a diagram showing the relationship between a reaction resistance determined by the exponential function and the SOH.

FIG. 9 is a diagram showing the relationship between the reaction resistance determined by formula (2) and the measurement values of the initial capacity of 27 secondary batteries. In FIG. 9, the horizontal axis indicates the reaction resistance Rct, and the vertical axis indicates the SOH. As shown in this diagram, the reaction resistance Rct and the SOH have a high determination coefficient of about 0.8777. Accordingly, it is possible to detect the state of the secondary battery 14 using the exponential function indicated in formula (2) as well.

As described above, according to the second embodiment, the state of the secondary battery 14 is detected by subjecting the secondary battery 14 to a pulse discharge, dividing the voltage value at that time by the current value, recording the result as time series data, fitting the recorded time series data of the resistance value using the exponential function indicated in formula (2), and using a coefficient A (RCT). As a result, because multiple discharges are not executed, it is possible to prevent power consumption of the secondary battery 14. Further, because complex calculations are not required, it is possible to use an inexpensive processing unit that does not have a high processing capability as the CPU 10a.

Figure 10:
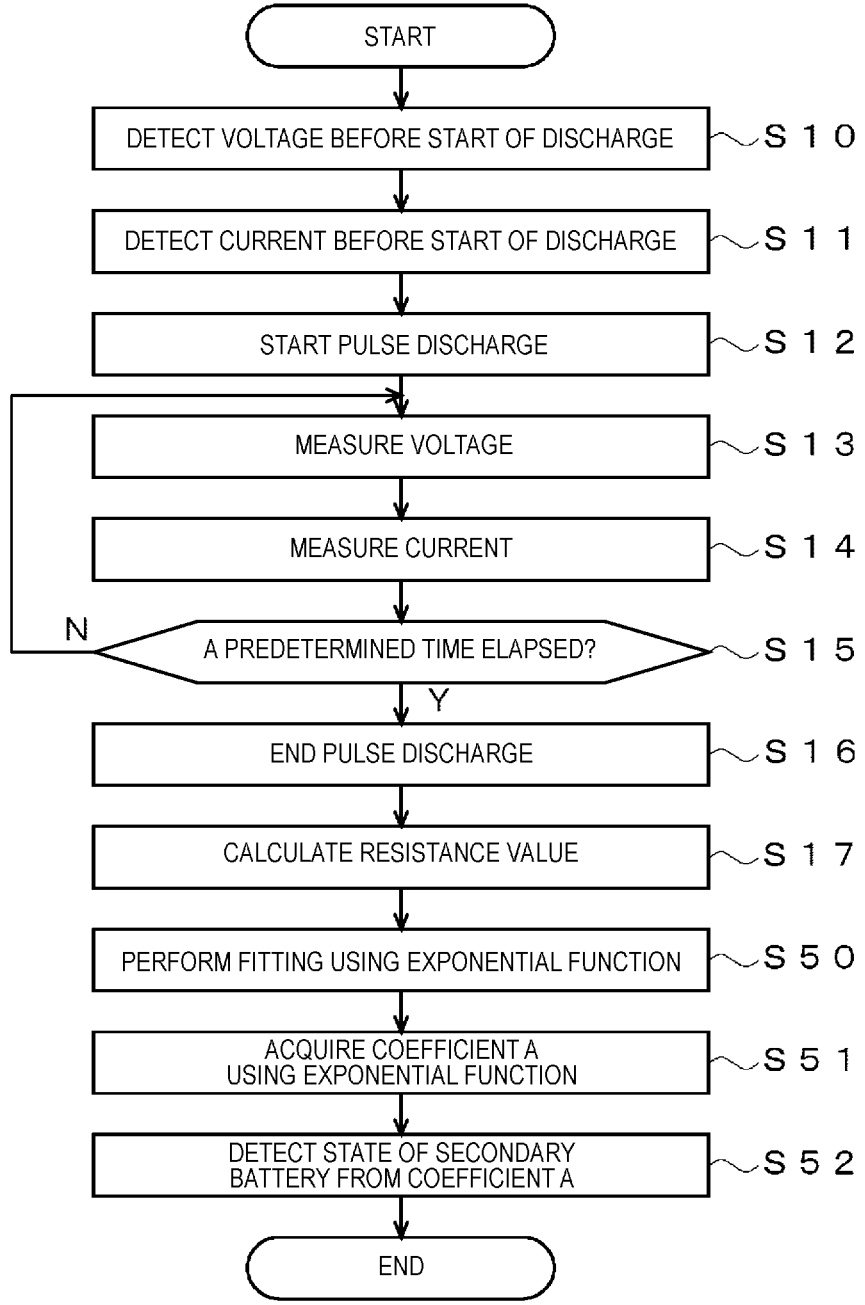
FIG. 10 is a flowchart for explaining the flow of processing executed in the second embodiment.

Next, the processing executed in the second embodiment will be described with reference to FIG. 10. It should be noted that, in FIG. 10, the processing corresponding to FIG. 6 is denoted using the same reference numbers, and descriptions thereof will be omitted. In FIG. 10, compared to FIG. 6, steps S18 to S20 are replaced with steps S50 to S52. All other processing is the same as in FIG. 6, and thus the following describes the processing with a focus on steps S50 to S52.

In step S50, the CPU 10a fits the time-series resistance values R (tn) determined in step S17 using the exponential function f (tn) indicated in the aforementioned formula (2), and determines the coefficients A, B, and $\tau$. More specifically, for example, the CPU 10a performs exponential function fitting by using a least square operation or a Kalman filter operation, making it possible to acquire the values of these coefficients.

In step S51, the CPU 10a acquires the coefficient A of the exponential function determined in step S50.

In step S52, the CPU 10a detects the state of the secondary battery 14 on the basis of the coefficient A acquired in step S51. More specifically, when degradation in the secondary battery 14 advances, the value of the coefficient A increases, making it possible to detect the degradation state of the secondary battery 14 on the basis of the level of the value of the coefficient A.

It should be noted that while, according to the above processing, the resistance value is acquired by directly dividing the voltage value measured in step S13 by the current value measured in step S14, the resistance value R (tn) may be determined by, for example, dividing a voltage ΔV (tn) of a difference acquired by subtracting the voltage Vb before the start of discharge from the measured voltage value, by the current value I (tn).

Further, the variation in the resistance value caused by the temperature of the secondary battery 14 may be stored as a table in the ROM 10b, and the resistance value determined in step S17 may be temperature-corrected on the basis of the temperature of the secondary battery 14, the temperature being detected with reference to the output of the temperature sensor 13. According to such a method, it is possible to prevent the occurrence of an error caused by temperature.

(D) Description of Modified Embodiment

Needless to say, each of the above embodiments is but one example, and the present invention is not limited thereto. For example, in each of the above embodiments, the used formulas (1) and (2) are examples, and formulas other than these may be used. For example, while a base e of a natural logarithm is used in the example of formula (2), a base other than this may be used. Further, for "1−exp(−tn/τ)," a formula other than this may be used, and terms other than these may also be included.

Further, while the state of the secondary battery 14 is detected on the basis of one discharge in each of the above embodiments, the state may of course be detected on the basis of multiple discharges. In such a case, for example, the second and subsequent discharge may be executed at about several minute to several hour intervals, and the state of the secondary battery 14 may be determined from the average value of the acquired results.

Further, while both voltage and current are detected in each of the above embodiments, only the voltage may be detected in a case where there is a small amount of variation in the current or in a case where discharge is performed by a constant current circuit, for example.

Further, while the state of the secondary battery 14 is detected using only the coefficient A corresponding to the reaction resistance Rct in the second embodiment described above, the state may be determined using at least one of the ohmic resistance Rohm and the electric double layer capacity C. For example, the state may be detected using the reaction resistance Rct and the ohmic resistance Rohm, or the reaction resistance Rct and the electric double layer capacity C, or the state may be detected using all of the reaction resistance Rct, the ohmic resistance Rohm, and the electric double layer capacity C. It should be noted that if the state is determined using these, it is possible to determine the SOH or a state of function (SOF; dischargable capacity from fully charged state) as well as the relationship between these coefficients to determine the SOH or the SOF on the basis of this relationship.

Further, the flowcharts illustrated in FIG. 6 and FIG. 10 are examples, and the processing may be executed in a sequence other than these, or processing other than these may be executed.

Further, while the value of the reaction resistance and the SOH are determined in each of the above embodiments, the idling of the engine 17 may be reduced, that is, idle reduction may be controlled on the basis of the determined reaction resistance, for example. Specifically, idle reduction may be executed if the value of the reaction resistance is determined to be less than a predetermined threshold value, and not executed if the value is determined to be greater than the predetermined threshold value. Alternatively, the engine may not be stopped if a voltage drop determined from the reaction resistance Rct and the current introduced to the starter motor 18 is equal to or greater than a predetermined voltage. Further, the operation of the load 19 may be stopped if the SOH is close to the aforementioned threshold value, for example, in order to prevent further power consumption of the secondary battery 14. Further, a message instructing the user to replace the secondary battery 14 may be displayed if the SOH is less than a predetermined value.

REFERENCE NUMERALS

1 Secondary battery state detecting device
10 Controller (controlling means, calculating means, detecting means)
10a CPU
10b ROM
10c RAM
10d Display
10e I/F
11 Voltage sensor
12 Current sensor
13 Temperature sensor
14 Secondary battery
15 Discharge circuit (discharge means)
16 Generator
17 Engine
18 Starter motor
19 Load

The invention claimed is:

1. A device, comprising:
discharge means for subjecting a secondary battery to at least one pulse discharge;
acquiring means for controlling the discharge means to subject the secondary battery to the at least one pulse discharge, measuring a voltage value during a pulse discharge of the at least one pulse discharge a plurality of times to generate a plurality of voltage values, and acquiring a time variation value during the pulse discharge of the at least one pulse discharge;
calculating means for calculating a parameter of a predetermined function having time as a variable by fitting the time variation value of the plurality of voltage values during the pulse discharge of the at least one pulse discharge, using the predetermined function;
detecting means for detecting the state of the secondary battery on the basis of the parameter of the predetermined function; and
communicating means for communicating with an electric control unit and notifying the electric control unit of detected information for the detecting the state of the secondary battery.

2. A device, comprising:
discharge means for subjecting a secondary battery to at least one pulse discharge;
acquiring means for controlling the discharge means to subject the secondary battery to the at least one pulse discharge, measuring voltage during a pulse discharge of the at least one pulse discharge a plurality of times, acquiring a first voltage value before a start of the pulse discharge of the at least one pulse discharge, and acquiring a second voltage value during the pulse discharge;

calculating means for calculating a parameter of a predetermined function by fitting using a linear function or an exponential function, wherein a time variation value associated with the linear function or the exponential function comprises a difference value between the first voltage value and the second voltage value;

detecting means for detecting a state of the secondary battery on the basis of the parameter of the predetermined function calculated by the calculating means; and communicating means for communicating with an electric control unit and notifying the electric control unit of detected information for the detecting means for the detecting the state of the secondary battery.

3. The device according to claim 2, wherein the calculating means calculates the parameter of the predetermined function with a value acquired by dividing the time variation value during the pulse discharge by a corresponding time variant current value during the pulse discharge.

4. The device according to claim 2, wherein:
the predetermined function is a linear function having time as a variable; and
the detecting means detects the state of the secondary battery on the basis of a slope of the linear function.

5. The device according to claim 2, wherein:
the predetermined function is an exponential function having time as a variable; and
the detecting means detects the state of the secondary battery on the basis of a coefficient of the exponential function.

6. The device according to claim 2, wherein:
the predetermined function is an exponential function having time as a variable;
the detecting means detects the state of the secondary battery on the basis of a coefficient of the exponential function; and
the detecting means calculates a resistance value of a reaction resistance of the secondary battery from the coefficient of the exponential function, and detects the state of the secondary battery on the basis of the resistance value.

7. The device according to claim 2, wherein:
the predetermined function is an exponential function having time as a variable;
the detecting means detects the state of the secondary battery on the basis of a coefficient of the exponential function; and
the detecting means calculates at least one of a capacity value of an electric double layer capacity and a resistance value of an ohmic resistance of the secondary battery from the coefficient of the exponential function, and detects the state of the secondary battery using at least one of the capacity value and the resistance value.

8. The device according to claim 2, wherein the calculating means performs the fitting using the predetermined function based on a least square operation or a Kalman filter operation.

9. The device according to claim 2, wherein the detecting means calculates at least one of an initial capacity of the secondary battery, a degradation degree of the secondary battery, and a dischargable capacity from a fully charged state of the secondary battery on the basis of the parameter calculated by the calculating means.

10. A method, comprising:
initiating, by a system comprising a processor and a memory, a group of pulse discharges of a secondary battery;
measuring, by the system, a voltage value during a pulse discharge of the group of pulse discharges a plurality of times to generate a plurality of voltage values;
acquiring, by the system, a time variation of the plurality of voltage values during the pulse discharge of the group of pulse discharges;
calculating, by the system, a parameter of a time variant predetermined function by fitting a linear function or an exponential function;
determining, by the system, a state of the secondary battery based on the parameter of the time variant predetermined function;
communicating, by the system, with an electric control unit; and
notifying, by the system, the electric control unit of detected information for the determining the state of the secondary battery.

11. The method of claim 10, wherein the time variation of the voltage value is a function of a time variation of a resistance value, and wherein the time variation of the resistance value is determined based on a voltage measurement during the group of pulse discharges and a current measurement during the group of pulse discharges.

12. The method of claim 10, wherein the time variant predetermined function is a linear function and the parameter is a slope of the linear function.

13. The method of claim 10, wherein the time variant predetermined function is an exponential function and the parameter is a coefficient of the exponential function.

14. The device according to claim 1, wherein the calculating means calculates the parameter of the predetermined function with a value acquired by dividing the time variation value during the pulse discharge by a corresponding time variant current value during the pulse discharge.

15. The device according to claim 1, wherein:
the predetermined function is a linear function having time as a variable; and
the detecting means detects the state of the secondary battery on the basis of a slope of the linear function.

16. The device according to claim 1, wherein:
the predetermined function is an exponential function having time as a variable; and
the detecting means detects the state of the secondary battery on the basis of a coefficient of the exponential function.

17. The device according to claim 1, wherein:
the predetermined function is an exponential function having time as a variable;
the detecting means detects the state of the secondary battery on the basis of a coefficient of the exponential function; and
the detecting means calculates a resistance value of a reaction resistance of the secondary battery from the coefficient of the exponential function, and detects the state of the secondary battery on the basis of the resistance value.

18. The device according to claim 1, wherein:
the predetermined function is an exponential function having time as a variable;
the detecting means detects the state of the secondary battery on the basis of a coefficient of the exponential function; and
the detecting means calculates at least one of a capacity value of an electric double layer capacity and a resistance value of an ohmic resistance of the secondary battery from the coefficient of the exponential function, and detects the state of the secondary battery using at least one of the capacity value and the resistance value.

19. The device according to claim 1, wherein the calculating means performs the fitting using the predetermined function based on a least square operation or a Kalman filter operation.

20. The device according to claim 1, wherein the detecting means calculates at least one of an initial capacity of the secondary battery, a degradation degree of the secondary battery, or a dischargable capacity from a fully charged state of the secondary battery on the basis of the parameter calculated by the calculating means.

* * * * *